MODIFIED WIEN BRIDGE OSCILLATOR

Filed Jan. 11, 1954 2 Sheets-Sheet 1

INVENTOR.
Bernard M. Oliver
BY Flehr & Swain
ATTORNEYS

Sept. 16, 1958 B. M. OLIVER 2,852,675

MODIFIED WIEN BRIDGE OSCILLATOR

Filed Jan. 11, 1954

2 Sheets-Sheet 2

INVENTOR.
Bernard M. Oliver
BY Flehr & Swain
ATTORNEYS

United States Patent Office 2,852,675

Patented Sept. 16, 1958

2,852,675

MODIFIED WIEN BRIDGE OSCILLATOR

Bernard M. Oliver, Palo Alto, Calif., assignor to Hewlett-Packard Company, Palo Alto, Calif., a corporation of California Application January 11, 1954, Serial No. 403,270

6 Claims. (Cl. 250—36)

This invention relates generally to variable frequency oscillation generators and particularly to generators which are relatively stable as to the selected frequency of operation and which are capable of being tuned over wide ranges of frequencies.

In Patents 2,268,872; 2,583,649; and 2,583,943, issued to W. R. Hewlett, there are disclosed oscillation generators which can be adjusted over a wide range of frequencies and which have a relatively high degree of frequency stability. In all of these circuits a two stage amplifier circuit is provided with positive feedback via a Wien bridge containing resistance and capacity elements, and which is a frequency determining network for the oscillator. A thermally sensitive resistance is provided in these circuits in one arm of the bridge which is also the cathode lead of the first amplifier stage. This resistance, by means of negative feedback action, limits the amplitude of the oscillation to a level at which the amplifier is still linear. When the bridge is in balance, it thus provides a simultaneous determination of oscillation frequency and amplitude.

Prior oscillators of the type described above provide certain characteristics which are desirable for a general purpose laboratory oscillator, namely, wide tuning range with relatively good frequency stability, but they do not provide the desired stability with respect to changes of load. Thus, they are subject to changes in output voltage, frequency shift, and distortion for changes in load conditions. Also, they are not well adapted to supply either a balanced or an unbalanced output.

In general it is an object of this invention to provide a Wien bridge oscillator having a wider tuning range than previous Wien oscillators.

It is a further object of this invention to provide a Wien bridge oscillator having a purity of output wave form that is substantially unaffected by changes in load, over a very wide range of load conditions.

Another object of this invention is to provide a Wien bridge oscillator, having a frequency of oscillation that is substantially unaffected by changes in load, over a very wide range of load conditions.

Another object of this invention is to provide a Wien bridge oscillator having an output level that is substantially unaffected by changes in load, over a wide range of load conditions, without the necessity for a buffer amplifier.

Further objects of the invention will appear from the following description in which the preferred embodiment has been set forth in detail in conjunction with the accompanying drawing.

Referring to the drawing.

In general the present invention employs a balanced circuit with none of the bridge terminals grounded, and with a thermally sensitive element included as a part of the bridge circuit. When this arrangement is combined with a bridge circuit having zero voltage between either output terminal and ground at balance, the residual capacities to ground of the bridge circuit elements do not affect the frequencies of oscillation at high frequencies, because these stray elements appear in the amplifier circuit rather than in shunt with the bridge circuit. Also the use of a balanced circuit is advantageous in that it permits the use of positive feedback in the output amplifier stage without the necessity for transformers for the purpose of providing positive feedback.

Another feature of the present invention is that a special amplifier circuit is used which has "crisscross" positive feedback in the final stage. The degree of positive feedback is a function of the load and increases as the load impedance decreases, thus tending to maintain the output constant regardless of load, both with respect to output amplitude and purity of wave form.

Figure 1:
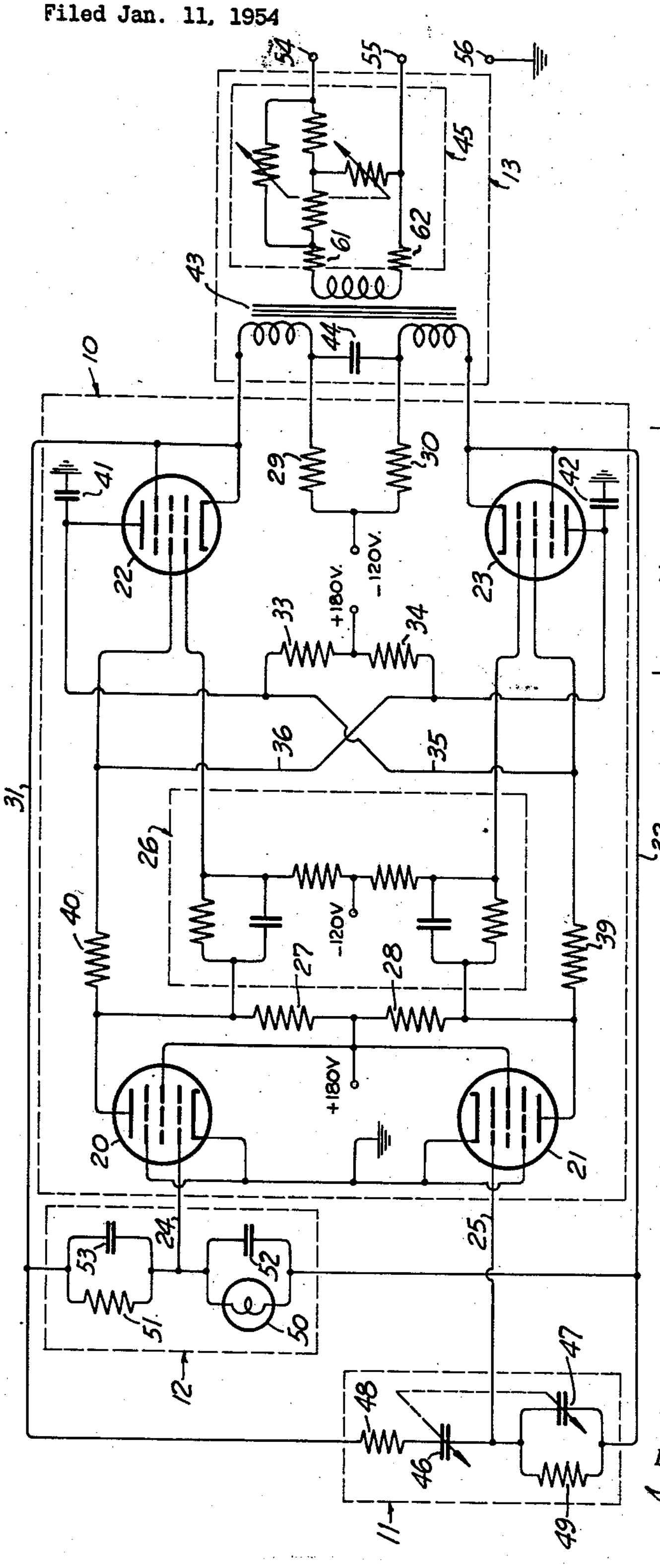
Figure 1 is a circuit diagram illustrating one embodiment of the invention.

In Figure 1 an oscillation generator is shown including an amplifier circuit 10, feedback circuits 11 and 12, and output circuit 13. Amplifier circuit 10 is a balanced push-pull circuit comprising a first amplifier stage including vacuum tubes 20 and 21, followed by a cathode follower stage including vacuum tubes 22 and 23. In practice tubes 20 and 21 can be of the type known by manufacturers' specifications as No. 6AC7 and tubes 22 and 23 as No. 6AU5, with each tube having plate, suppressor grid, screen grid, control grid and cathode elements. Amplifier circuit 10 receives its input voltage at the control grids of tubes 20 and 21, on the leads 24 and 25. The output signal from the first amplifier stage appears at the plates of tubes 20 and 21, and this signal is applied to the control grids of tubes 22 and 23 via an R–C coupling network of conventional design, indicated as circuit 26. This network should be designed to have substantially flat characteristics for the entire frequency range of the oscillator. Resistors 27 and 28 are the plate resistors of tubes 20 and 21 respectively, and connected to a suitable source of plate voltage as indicated. The cathode follower stage includes cathode resistors 29 and 30 connected between the cathodes of tubes 22 and 23, respectively and a source of negative potential, indicated in Figure 1 as −120 volts. The two primary windings of transformer 43 appear in series with resistors 29 and 30, rsepectively, and the impedance seen at each primary winding thus appears in the cathode circuit of tubes 22 and 23. The suppressor grids of tubes 22 and 23 are tied to cathode potential and the two cathode voltages are returned to feedback circuits 11 and 12 via leads 31 and 32. Resistors 33 and 34 are the plate resistors of tubes 22 and 23, respectively. A crisscross positive feedback circuit between tubes 22 and 23 is provided by the connections 35 and 36 from the plates of tubes 22 and 23, respectively, to the screen grids of tubes 23 and 22. Resistors 39 and 40 are connected between the plates of tubes 22 and 23, respectively, and the plates of tubes 21 and 20, respectively. Condensers 41 and 42 are connected between the plates of tubes 22 and 23 and ground, respectively.

The output of the amplifier circuit 10 appears at the cathodes of tubes 22 and 23 and is supplied to the primary winding of transformer 43. This winding is split and condenser 44 is connected in series with the two parts. The secondary of transformer 43 supplies a conventional bridged T attenuator 45, which may have variable resistors as indicated, and which includes series padding resistors 61 and 62.

The frequency of oscillation may be adjusted by varying the condensers 46 and 47 in the feedback circuit 11 which may be ganged as indicated. This circuit also includes resistor 48 in series with condenser 46 and resistor 49 in parallel with condenser 47. In practice, resistors 48 and 49 may be varied in steps to provide range switching. With fixed resistors it is convenient to provide only a 10 to 1 frequency change by a 10 to 1 change in capacity. To provide the full desired frequency range of 100,000 to 1 it is most convenient to change resistors so that each resistor corresponds to a frequency decade such as 5 C. P. S. to 50 C. P. S. The amplitude of oscillation is limited to a specified amplitude by the thermally sensitive resistor 50 and the resistor 51, in the feedback circuit 12. This circuit also includes condensers 52 and 53 in parallel with resistors 50 and 51, respectively. The output of the oscillator appears as a balanced voltage between output terminals 54 and 55, or by connecting either of these terminals to grounded terminal 56, an unbalanced output may be obtained.

Figure 2:
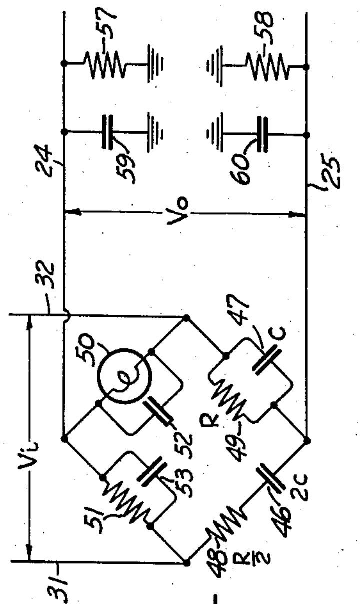
Figure 2 is a circuit diagram illustrating a Wien bridge including a non-linear resistor.

The basic operation of this circuit can be explained most simply by reference to Figure 2, which illustrates the feedback circuits 11 and 12 of Figure 1 redrawn with certain of the resistors and condensers given symbols. Resistor 49 is given the value R, condenser 47 the value C, resistor 48 the value R/2, and condenser 46 the value 2C. Additional resistors 57 and 58 are indicated between leads 24 and 25, respectively, and ground along with condensers 59 and 60 in parallel with resistors 57 and 58, respectively. These additional resistors and condensers represent the stray capacity and leakage resistance between the grids of tubes 20 and 21 and ground, such as might be caused by the residual capacity of the rotors of condensers 46 and 47 to ground. The basic circuit is seen to be a conventional Wien bridge with the exception of thermally sensitive resistance 50, and the condensers 52 and 53, which are merely trimmer capacities and do not affect the basic operation of the circuit. Typical values for these condensers are 5 $\mu\mu$f. The thermal time constant of resistance 50 is large in comparison with the period of the lowest frequency of oscillation so that its resistance does not change appreciably during a cycle of the oscillation frequency. In practice this resistance can be provided by a pair of series connected conventional incandescent lamps of the order of 10 watts rated power each. In considering the operation of the circuit this resistance can thus be viewed as a constant linear resistance for any given amplitude voltage $V_i$ applied to the bridge.

The operation of the bridge circuit of Figure 2 is qualitatively as follows: Assume that the input voltage $V_i$ between leads 31 and 32 can have a wide range of amplitudes and frequencies, but is always a pure balanced voltage, i. e. the voltage on lead 31 with respect to ground is always equal in magnitude and 180° out of phase with the voltage on lead 32 with respect to ground. As the frequency of operation is varied, for a fixed amplitude $V_i$, the output voltage $V_o$ between leads 24 and 25 goes through a minimum at a frequency near the frequency at which the series R/2–2C circuit has an impedance equal to the impedance of the parallel R–C circuit. For an amplitude voltage just sufficient to make the resistance of the lamps equal to the resistance of resistor 51, bridge transmission, that is the ratio of $V_o$ to $V_i$, goes through zero at the frequency $f=\frac{1}{2}\pi RC$. Conversely, if the frequency is set at this value and the ampiltude of $V_i$ varied, bridge transmission goes through zero when the amplitude is just sufficient to make the lamp resistance equal to the value of resistor 51. For all higher or lower amplitudes of $V_i$, bridge transmission will be greater than zero.

If the bridge output voltage $V_o$ is now fed through an amplifier circuit with considerable gain and the output of the amplifier circuit returned to the bridge input as $V_i$, the system will oscillate. At very small amplitudes of oscillation resistor 50 will have a low resistance and the bridge transmission will be high, resulting in a steadily increasing voltage being fed back to the bridge input. As the bridge input voltage increases, however, the lamp 50 will warm up and the bridge transmission will decrease until the transmission loss is just equal to the amplifier gain. The circuit may thus be designed to operate with the tubes of the amplifier all operating in the linear portions of their characteristics and a very pure sine wave of oscillation obtained.

If the amplifier gain is fairly high, the bridge will tend to operate very nearly at balance with a very large transmission loss equal to the amplifier gain, and the voltage $V_o$ will consequently need to have only a very small value. Thus the voltage on leads 24 and 25 is both small as measured between leads and as measured to ground. Therefore in practice the amplifier 10 has been constructed to have a fairly high gain for example, of the order of 40 db.

The effects of any stray capacity or leakage resistance, either between the leads or to ground as represented by resistors 57 and 58 and condensers 59 and 60, is minimized because only the voltage to be amplified appears across these elements and very little current can flow through them. In other words, the effect of any stray capacity or leakage resistance is transferred from the frequency determining circuit, i. e. the bridge, to the amplifier circuit and thus only affects the frequency response of the amplifier, which is of secondary importance. If an unbalanced circuit is used, the stray capacity and leakage resistance can shunt the bridge arms and seriously interfere with the oscillator calibration or entirely prevent reaching some frequencies.

Since very high resistances, of the order of several megohms, are often used in the frequency determining circuit, quite modest leakage paths can be of considerable importance, if they have the bridge currents flowing through them. This problem has been essentially eliminated in the circuit of the invention by use of a bridge circuit having no bridge terminal grounded, and designed to have zero output voltage from either output terminal to ground at balance.

Another important advantage of a true balanced oscillator, i. e. a circuit in which a balanced amplifier follows a bridge circuit having none of its terminals grounded, arises in connection with the distortion introduced by the thermally sensitive resistance 50. The thermal time constant of the lamp is normally chosen to be of the same order of magnitude as the period of the lowest frequency at which the oscillator is to operate. Any longer time constant is wasteful in terms of lamp power warmup time, etc. Alternatively, it is more economical to operate with as short a lamp time constant as possible without introducing unwanted distortion due to heating and cooling of the lamp during a cycle, and the consequent change of resistance during a cycle. In an unbalanced circuit in which the D. C. component of the plate current of the first amplifier stage passes through the lamp, the effect of the oscillation current is to superimpose a component of A. C. resistance variation on a fixed D. C. "hot" resistance value, at low frequencies. In a balanced circuit, such as shown in Figure 1, there is no D. C. component of current flowing in the lamp and the lamp resistance at low frequency fluctuates from the "hot" value which is determined by the oscillatory current alone. The resistance of the lamp is determined by its temperature which in turn is determined by the power supplied to the lamp, and the power is proportional to the square of the current flowing through the lamp. In the case where there is D. C. flowing through the lamp, to a first approximation, the current is given by the function $(A+\sin \omega t)$ where A is a constant. The square of the current contains the terms.

$$A^2+2A \sin \omega t+\sin^2 \omega t$$

and thus has both fundamental and second harmonic components of variation, since the $\sin^2 \omega t$ can be resolved in a constant plus a second harmonic. In the balanced circuit, however, the current is simply sin $\omega t$ and the square of the current, $\sin^2 \omega t$, contains only second harmonic variations. The current flowing in the lamp, which has a resistance variation as described above, intermodulates with the resistance variation components to give only a third harmonic distortion term in the case of the balanced circuit, but both second and third harmonic distortion in the unbalanced circuit where there is a D. C. component of current through the lamp. The net result is to permit operation of the balanced circuit at a lower frequency in comparison with the thermal time constant of the lamp, for a given percentage distortion than is possible with an unbalanced circuit.

As previously explained in Figure 1 two stages of amplification are included in the amplifier circuit 10, and tubes 20 and 21 form a simple voltage amplifier stage. The plate voltages of tubes 20 and 21 are applied to the control grids of tubes 22 and 23, respectively, via grid network 26, and the tubes 22 and 23 are part of a special cathode follower stage which uses positive crisscross feedback in the plate circuits. With this arrangement the plate of tube 22 is connected through a voltage divider consisting of resistors 28 and 39, to the input of the grid network of tube 23. The screen grid of tube 23 also receives a portion of the plate voltage of tube 22. A similar connection is made between the plate of tube 23 and the control and screen grids of tube 22. Suppose a pure balanced push-pull signal appears at the plates of tubes 20 and 21, such that the plate voltage of tube 20 is increasing and the plate voltage of tube 21 is decreasing at some instant of time. These voltages are applied to the control grids of tubes 22 and 23, causing the plate current in tube 22 to increase and the plate current in tube 23 to decrease. The increasing current from tube 22 flowing through resistor 33 causes the plate voltage of tube 22 to drop, and since a portion of this voltage is applied to the control and screen grids of tube 23, the current in tube 23 will decrease more than it would due to the action of the applied signal from tube 21 alone. A similar action takes place as a result of the symmetrical feedback from tube 23 to tube 22. This is a positive feedback action, and, if too strong, would cause undesired self-oscillation of the amplifier circuit. The degree of feedback within the amplifier must be accurately chosen to avoid such oscillation, and this is done by proper choice of resistors 33, 34, 39, and 40, and by carefully controlling the plate and cathode impedances over the entire frequency range of the oscillator. When the cathode to cathode impedance from tube 22 to tube 23 is zero, the degree of positive feedback is adjusted to a point just short of oscillation. For any finite cathode to cathode impedance, the circuit is then non-oscillatory.

At high frequencies an increase in the local positive feedback is avoided by lowering the plate impedance of tubes 22 and 23 by the addition of the condensers 41 and 42 which would, typically, have a value of 100 $\mu\mu$f. each, effectively in parallel with the plate resistors 33 and 34. By this arrangement the net feedback in the cathode follower stage is kept from exceeding unity even when the negative feedback provided by the cathode to cathode impedance is effectively removed.

At very low frequencies the margin between successful operation and self-oscillation of the amplifier circuit 10 is small if the cathode to cathode impedance of the cathode follower stage becomes very low. In an ordinary case, the transformer winding resistance will be sufficient to permit satisfactory operation at extremely low frequencies with a short circuit load. Series padding resistors 61 and 62 also provide a fixed maximum load in the transformer secondary even if the output terminals are shorted. Maintenance of high negative feedback by keeping the cathode to cathode impedance high at D. C. is also important in preventing a D. C. unbalance, i. e. a fixed difference in voltage between the opposite sides of the balanced circuit. If negative feedback were not provided for D. C., a small unbalance due to grid current in the first amplifier stage could be amplified and produce a fixed D. C. unbalance. Condenser 44 is added to preserve the loop gain at D. C.

An important feature of the oscillator of the invention is its relatively complete freedom from distortion or frequency shift resulting from chanegs in load conditions. A similar performance could be obtained from a conventional oscillator by adding a buffer amplifier stage, but at much greater cost. In the circuit of Figure 1, positive feedback in the cathode follower output amplifier stage provides an essentially zero output impedance as seen by the cathode to cathode load. The cathode load includes any external load in series with resistors 61 and 62 which provide an oscillator output impedance of 600 ohms in a typical case, and this is maintained at this value at the oscillator terminals independent of external load.

As the external load is varied from an open circuit to a short circuit, the degree of feedback from the crisscross network varies and may provide as much as a two to one change in the A. C. plate current of the output stage, for a typical design. For a cathode to cathode impedance high in comparison with the plate resistors 33 and 34, the circuit behaves essentially as a simple dual cathode follower. For a cathode to cathode impedance comparable to the value of the plate resistances, the crisscross positive feedback becomes operative and effectively increases the plate current for a given applied grid voltage in just the proper proportion to maintain the voltage from cathode to cathode constant. Thus a very low resistance load reduces the negative feedback normally present as a result of the cathode to cathode impedance and this raises the net feedback positively so that the output voltage tends to increase and compensate for the lower impedance load. The circuit of Figure 1 may be adjusted to give very nearly perfect compensation over most of the frequency range with the exception of the very high and very low frequencies. As a result, the net output impedance remains constant and effectively zero, and changes in load have almost no effect on the frequency or waveform of the oscillations, because the feedback voltage to the Wien bridge is delivered from a zero impedance source and the feedback voltage is therefore essentially independent of the load.

This very low effective output impedance circuit permits the use of transformers at the output with relatively easy to obtain characteristics, and which can provide all the advantages of a transformer output at low cost. In practice it sometimes proves convenient to use more than one transformer, the appropriate transformer for the particular frequency range being switched in by a frequency range switch. Such a switch is commonly provided in any case to substitute different values of resistors 48 and 49 for different frequency ranges. Optimum transformer design may then be used for each frequency range with additional savings in cost and improvement of performance. A simple T-pad attenuator 45 is shown in Figure 1 to control the output voltage amplitude, the series resistor being shorted and the shunt resistor opened at zero attenuation setting. A more complex H-pad could also be used if a more perfectly balanced output signal were desired.

The circuit of Figure 1 employing crisscross feedback from plate to grid is a convenient and simple method of providing positive feedback in proportion to cathode loading. It would be possible to provide a similar effect in an unbalanced circuit by means of transformers, to provide the necessary 180° phase shift between plate and cathode, but this would be fairly costly in relation to the circuit of the present invention and would require careful control of the transformer characteristics over a wide band of frequencies.

Figure 3:
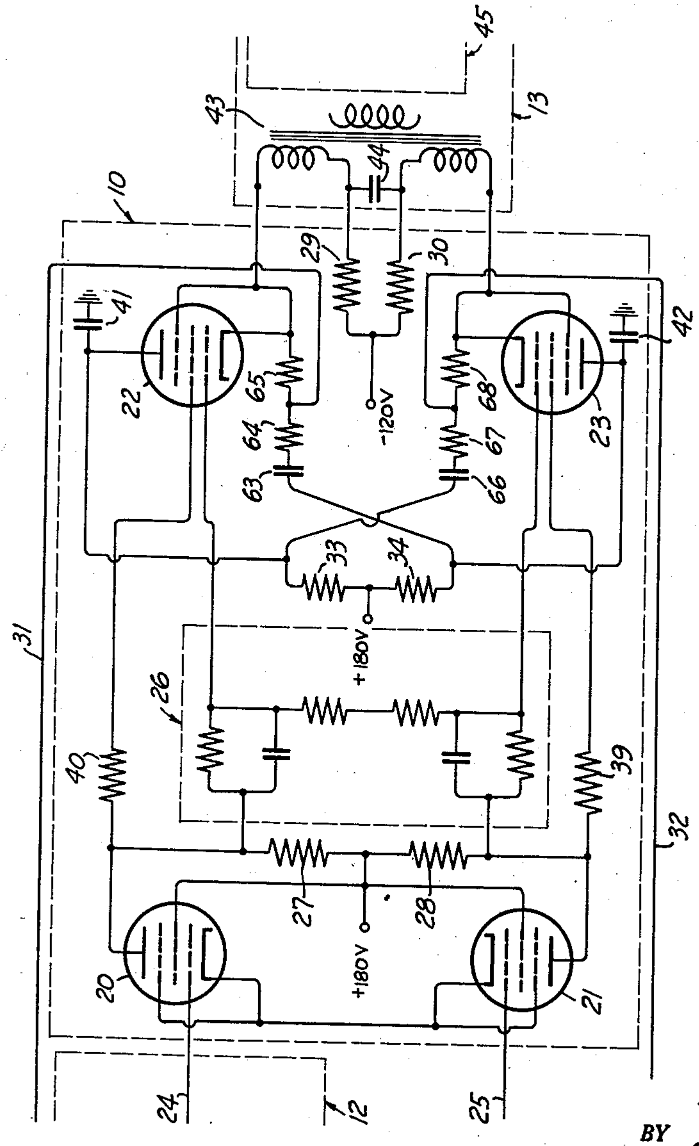
Figure 3 is a circuit diagram illustrating another embodiment of the invention.

In a balanced amplifier it is also possible to provide a feedback voltage to the Wien bridge which is substantially unaffected by load changes by a bridge feedback network as shown in Figure 3. Referring to Figure 3, the circuit is identical to the amplifier circuit of Figure 1 in most respects, with the exception of the interconnections between tubes 22 and 23. In Figure 3 there is no connection between the plates of tubes 22 and 23 and their respective grids, i. e. leads 35 and 36 have been eliminated. In the circuit of Figure 3 the plate of tube 23 is connected to the cathode of tube 22 through condenser 63 and resistors 64 and 65. Feedback voltage to the Wien bridge is taken through lead 31 which in this case is connected to thet point between resistors 64 and 65. The plate of tube 22 is connected through condenser 66 and resistors 67 and 68 to the cathode of tube 23. Lead 32 is tapped on between resistors 67 and 68. In this circuit resistors 64, 65, 67, and 68 all normally have equal values. Condensers 63 and 66 have negligible reactance in the main operating range of frequencies.

The operation of this circuit may be explained as follows: First, consider the effect of varying the load on the voltage transmitted to the Wien bridge on leads 31 and 32. If the voltages on the grids of tubes 22 and 23 are temporarily considered fixed and the values of the plate resistors 33 and 34 are chosen to be approximately equal to the reciprocal of the cathode transconductance of tubes 22 and 23, the plate voltages of the two tubes will be equal to their cathode voltages. And for this condition, the plate and cathode voltages of tube 22 will be equal and opposite to the voltages at the plate and cathode of tube 23. As the current drawn by the load is varied, the value of these voltages varies, but is maintained equal and opposite for the two tubes. If the resistors 64, 65, 67, and 68 are equal in value, the current drawn through the pair 64 and 65 will be equal to the current through 67 and 68, and, although the current may vary as a function of load, the voltage between the midpoints of the pairs will be unaffected.

It is easily seen that a signal applied to the grids of tubes 22 and 23 is transmitted to the leads 31 and 32, although variations in load current are not. For a fixed load, a signal applied between the grids of tubes 22 and 23 will cause a corresponding signal at the cathodes, e. g. if the grid voltage of tube 22 increases, the cathode voltage of 22 will increase as a result of the increased plate current in tube 22. The current in tube 23 is decreasing meanwhile and this results in opposite effects on the currents through the resistance pairs 64, 65 and 67, 68, i. e. the current through one pair increases when the current through the other pair decreases, as a result of an applied balanced grid voltage. Thus an applied signal results in a signal being transmitted to the Wien bridge on leads 31 and 32 in direct proportion to the applied signal. On the other hand, variations in load current do not result in a different signal being transmitted to the Wien bridge.

By way of example in one particular instance I constructed my oscillator as follows: The circuit of Figure 1 was employed, making use of tubes known by manufacturers' specifications as Nos. 6AC7 for the tubes 20 and 21 and No. 6AU5 for tubes 22 and 23. The various voltage sources had values as indicated in Figure 1. The resistors 48 and 49 of circuit 11 had values of from 25 megohms to 2500 ohms and from 50 megohms to 5000 ohms respectively, depending on the frequency band chosen. Condenser 46 was variable over a range of from 100 μμfd. to 1200 μμfd., and condenser 47 over a range of from 50 μμfd. to 600 μμfd. With respect to circuit 12, the resistor 51 had a value of 3000 ohms, and condensers 52 and 53 had values of 0 and 1.5–7 μμfd. respectively. The thermally sensitive element 50 comprised two conventional incandescent lamps each of 10 watts rated power at 220 volts. The values for the various resistors in the amplifier circuit 10 were as follows: 27 and 28, 22,000 ohms; 39 and 40, 68,000 ohms; 37 and 38, 0; 33 and 34, 500 ohms and 29 and 30, 2000 ohms. The condensers 41 and 42 of the amplifier circuit had values of 100 μμfd. each. Each of the primary windings of the transformer 43, with the other windings open-circuited, had an ohmic resistance of about 120 ohms and an inductance of about 300 henries. Condenser 44 connected between the windings had a value of 100 μfd. This oscillator was adjustable over a frequency range of from 5 C. P. S. to 600 kc./s., by the adjustment of condensers 46 and 47, and by switching resistors 48 and 49 through 5 positions, one position per frequency decade. Over the entire range of operation the frequency of operation was relatively stable. Also the frequency of operation remained stable at any point within this range for a wide variation in the load.

It will be evident that the circuit of the amplifier circuit 10 can be further modified within the scope of the invention, which should be limited only by the scope of the claims appended hereto.

I claim:

1. In an electronic oscillator, a balanced amplifier circuit comprising one pair of vacuum tubes connected to function as a voltage amplifier stage, and a second pair of vacuum tubes connected to function as a cathode follower stage and serving to receive the output from the amplifier stage, a load coupled to the cathode of the cathode follower tubes, and a bridge circuit serving to couple the output of the cathode follower stage to said control grids of the amplifier tubes, said bridge circuit comprising a first resistance arm, a second arm including a thermally sensitive resistance element, a third arm including a resistance and capacitance serially connected, and a fourth arm including resistance and capacitance connected in parallel, the control grid of one of said amplifier tubes being connected to the junction of the first and second arms and the control grid of the other of said amplifier tubes being connected to the junction of the said third and fourth arms, and one output terminal of said cathode follower stage being directly connected to the junction of the first and third arms and the other being directly connected to the junction of the second and fourth arms to provide a D.-C. feedback path to the bridge junctions, said first and second arms serving to form an amplitude limiting feedback path, and said third and fourth arms serving to provide a frequency determining feedback path.

2. An oscillator as in claim 1 including a positive feedback circuit connected between the plate of one of said cathode follower tubes and at least one element of the other tube, and between the plate of said other tube and at least one element of said one tube.

3. In an electronic oscillator, a balanced amplifier circuit including first and second stages, said first stage comprising a first pair of vacuum tubes connected to function as a voltage amplifier, and said second stage including a second pair of vacuum tubes connected to function as a cathode follower, an output transformer having a pair of primary windings, each primary winding having a terminal connected in the cathode lead of the corresponding vacuum tube of the cathode follower stage, and a bridge circuit comprising a first resistance arm, a second resistance arm including a thermally sensitive resistance element, a third arm including resistance and capacitance elements serially connected, and a fourth arm including resistance and capacitance elements connected in parallel, the control grid of one of said amplifier tubes being connected to the junction of the first and second arms and the control grid of the other of said tubes being connected to the junction of said third and fourth arms, and the cathode of one of said cathode follower tubes being connected directly to the junction of the first and third arms and the cathode of the other of said cathode follower tubes being connected directly to the junction of the second and fourth arms, said first and second arms providing a feedback amplitude limiting circuit, and said third and fourth arms providing a feedback frequency determining circuit.

4. An oscillator as in claim 3 together with two compensating condensers, each condenser being connected between the plate of one of the cathode follower tubes and a point of neutral potential, said condensers serving to lower the plate impedance of the associated tube at the higher operating frequencies.

5. An oscillator as in claim 4 together with a condenser connected between the terminals of said windings which are remote from the terminals connected to the cathodes, said condenser providing a relatively high cathode-to-cathode impedance at zero frequency whereby large D.-C. feedback may be obtained.

6. An oscillator as in claim 5, together with means forming positive feedback paths connected between the plate of one of said cathode follower tubes and at least one element of the other of said cathode follower tubes, and the plate of said other tube and at least one element of said one tube whereby the output impedance is reduced to reduce effects of changes in load upon the operation of the oscillator.

References Cited in the file of this patent

UNITED STATES PATENTS

| | | |
|---|---|---|
| 2,319,965 | Wise | May 25, 1943 |
| 2,495,177 | Norde | Jan. 17, 1950 |
| 2,523,240 | Vackar | Sept. 19, 1950 |
| 2,566,981 | Clapp | Sept. 4, 1951 |
| 2,648,727 | Rockwell | Aug. 11, 1953 |

OTHER REFERENCES

Article entitled, "A Balanced R. C. Oscillator," by Bell, in Electronic Engineering, pages 274, 275, July 1951.